United States Patent [19]

Fuse et al.

[11] 4,370,360
[45] Jan. 25, 1983

[54] FILM TYPE LIGHT RECEIVING ELEMENT AND SPUTTER METHOD OF MANUFACTURING THE SAME

[75] Inventors: Mario Fuse; Mutsuo Takenouchi, both of Ebina, Japan

[73] Assignee: Fuji Xerox Co., Ltd., Tokyo, Japan

[21] Appl. No.: 242,735

[22] Filed: Mar. 11, 1981

[30] Foreign Application Priority Data

Mar. 14, 1980 [JP] Japan ............................ 55-31517

[51] Int. Cl.³ .......................................... H01L 27/14
[52] U.S. Cl. ...................................... 427/76; 427/87; 427/89; 427/126.2; 357/30; 428/623; 428/635; 428/636; 428/642; 430/128; 427/255.3
[58] Field of Search ............... 427/76, 126.2, 89, 87, 427/248 C; 428/623, 635, 636, 642; 357/29, 30, 90

[56] References Cited

U.S. PATENT DOCUMENTS

| | | | |
|---|---|---|---|
| 4,214,253 | 7/1980 | Hall | 357/29 |
| 4,234,625 | 11/1980 | Petrov et al. | 427/87 |
| 4,255,686 | 3/1981 | Maruyama et al. | 313/366 |

Primary Examiner—John D. Welsh
Attorney, Agent, or Firm—Sughrue, Mion, Zinn, Macpeak & Seas

[57] ABSTRACT

A film type light receiving element and a method for producing such an element in which the electric current ratio for light and dark input intensities is large while the resistance of an optically transmissive electrode is made low. Belt-shaped metal electrodes and a photoconductive film are provided on a smooth surface of an insulating substrate. The optically transmissive electrode film layer is formed on the photoconductive film. A portion of the optically transmissive electrode film adjacent the photoconductive film has a high specific resistance while the remaining portion has a low specific resistance. To form the portion having a low specific resistance, the film is formed by sputtering in an oxygen partial pressure close to a value at which a minimum specific resistance is obtained while to form the portion having a high specific resistance, the oxygen partial pressure is set to a value higher than the value at which the minimum specific resistance is obtained.

7 Claims, 6 Drawing Figures

FILM TYPE LIGHT RECEIVING ELEMENT AND SPUTTER METHOD OF MANUFACTURING THE SAME

BACKGROUND OF THE INVENTION

The present invention relates to a photoconductive film type light receiving element for converting data on ordinary clerical documents into electrical signals in time-series and to a method of manufacturing the same.

More specifically, the invention relates to a film type light receiving element in which a photoconductive non-crystalline film is formed, for instance, by vacuum evaporation on a flat and smooth insulating substrate on which belt-shaped electrodes are arranged in a desired density and in which an optically transmissive electrode is formed on predetermined parts of the belt-shaped electrodes. A film of Au or the like is used for each of the belt-shaped electrodes, an Se-As-Te film is used for the photoconductive non-crystalline film, and a high and low specific resistance layer of the Sn oxide or a film of a target compound $SnO_2$ or $In_2O_3$—$SnO_2$ (hereinafter referred to as "ITO") which is obtained by sputtering under a gaseous pressure $3 \times 10^{-3}$–$4 \times 10^{-3}$ Torr of a mixture of argon and oxygen with the ITO as a target material are used for the optically transmissive electrode. Furthermore, the invention pertains to a method of manufacturing the film type light receiving element.

FIG. 1 is a sectional view showing the structure of a conventional film type light receiving element. Belt-shaped electrodes 2, a photoconductive film 3 and an optically transmissive electrode 4 are formed on a flat and smooth substrate 1 in the stated order.

For instance, the substrate 1 is made of a highly insulative material such as quartz glass or Vycor ™ brand glass, the belt-shaped electrodes are formed of an Au film, the photoconductive film 3 is an Se-As-Te film or a CdSe film, and the optically transmissive electrode 4 is an In-Sn oxide film.

In FIG. 2, the curve I indicates specific resistance $\rho$ with oxygen partial pressure $P_o$ for the case where an $SnO_2$ film is formed on a glass substrate by a magnetron type sputtering device using an $SnO_2$ sintered substrate as a target. Both the specific resistances $\rho$ and the oxygen partial pressures $P_o$ are indicated by using logarithmic scales.

By forming on the flat and smooth substrate of Pyrex ™ glass 1 the belt-shaped electrodes, i.e. the Au films 2, the photoconductive film, i.e. the Se-As-Te film 3, and the optically transmissive electrode, i.e. the $SnO_2$ film 4 in the stated order, a light receiving element having a structure as shown in FIG. 1 is obtained.

In the conventional method, the electrical conductivity and the transmissivity of the optical transmissive electrode are considered important factors. However, the conventional method is disadvantageous in that the most important factor of the photoconductive conversion element, namely, the electric current ratio for light and dark thereof has been heretofore thought impossible to increase.

In order to eliminate the above-described difficulty, the inventors have proposed a method of manufacturing a film type light receiving element in which metal electrodes and a photoconductive film are provided in the form of layers on a flat and smooth substrate and an optically transmissive electrode film of tin oxide is formed thereon using a magnetron type sputtering technique wherein, by utilizing the fact that the electric current ratio for light and dark input intensities of the light receiving element varies according to the oxygen partial pressure of a sputtering atmosphere in the sputtering process and the ratio has a peak value, the oxygen partial pressure is set close to a value at which the electric current ratio for light and dark input intensities reaches its peak value. This method is described in U.S. patent application Ser. No. 242,736 filed on Mar. 11, 1981. This method is here specifically not described as nor is to be construed as being prior art so far as the instant application is concerned and is mentioned here only to aid in attaining a full understanding of the invention disclosed herein.

An Example of that method will be briefly described with reference to the case where the substrate 1 is an insulating glass or ceramic material having a high surface smoothness, the belt-shaped electrodes 2 are formed of an Au film with a Cr base, the photoconductive film 3 is an Se-As-Te series film, and the optically transmissive film 4 is an $SnO_2$ film which is formed by a magnetron type sputtering device using an $SnO_2$ sintered substance as a target.

The photoelectric conversion characteristic of the film type light receiving element having the aforedescribed structure depends on the quality of the material of each layer and the quality of each film. Especially the interface between the belt-shaped electrodes 2 and the photoconductive Se-As-Te film 3 and the junction interface between the Se-As-Te film 3 and the optically transmissive $SnO_2$ film 4 greatly affect the electric current ratio for light and dark input intensities.

The Se-As-Te film 3 acts as a P type photoelectric element. Therefore, it is desirable that the light receiving element be operated with the belt-shaped electrode 2 as the negative electrode and with the optically transmissive $SnO_2$ electrode 4 as the positive electrode. In this connection, it is preferable that the material of the negative electrode be Au, which has a low electron injection property, while the material of the positive electrode is an n type $SnO_2$ film which has a low Hall injection property.

As described in the above-referenced patent application an important factor in manufacturing the $SnO_2$ film is to use a magnetron type sputtering device with which the temperature of the substrate is increased only a little and the Se-As-Te film is not crystallized.

As is apparent from the curve I in FIG. 2, the point A at which the specific resistance $\rho$ is a minimum corresponds to a specific resistance of $2 \times 10^{-1}$ $\Omega$-cm and an oxygen partial pressure of $1.8 \times 10^{-4}$ Torr. In this case, the gaseous pressure of a mixture of argon and oxygen is $3.0 \times 10^{-3}$ Torr for a target of an $SnO_2$ sintered body. Accordingly, if it is desired only to minimize the electrical conductivity, an optically transmissive electrode having an excellent electrical conductivity can be obtained by forming the electrode under the sputtering conditions defined by the point A.

The curve II in FIG. 2 indicates the relations between electric current ratios for light and dark intensities when a predetermined electric field is applied to the light receiving element and for a sputtering gas oxygen partial pressure $P_o$. In FIG. 2, the electric current ratio for light and dark intensities becomes maximum at the point B. In this case, the oxygen partial pressure is $2 \times 10^{-4}$ Torr and the electric current ratio for light and dark intensities is 400. As is clear from FIG. 2, the oxygen partial pressure at the point B is not always equal to that at the point A.

If the above-described light receiving element is operated in an accumulation type photoelectric conversion system with a circuit as shown in FIG. 3, a signal as shown in FIG. 4 is produced. Also, if a number of circuits as shown in FIG. 3 are arranged in a row, a one-dimensional image sensor can be provided.

As is apparent from the curve II in FIG. 2, a light receiving element which is provided by forming the optically transmissive $SnO_2$ film 4 on the photoelectric film 3 by using the $SnO_2$ target under the oxygen partial pressure $2 \times 10^{-4}$ Torr and the gaseous pressure $3.5 \times 10^{-4}$ Torr of the mixture of oxygen and argon has a considerably high electric current ratio for light and dark intensities.

If a 90% $In_2O_3$–10% $SnO_2$ sintered body is used as the target, the sputtering process is carried out with a magnetron type sputtering device under an oxygen partial pressure ($2.5 \times 10^{-4}$ Torr) defined by the point B on the curve II in FIG. 5, the light receiving element so produced has a maximum electric current ratio for light and dark intensities. The electric current ratio is about 400.

However, if the optically transmissive electrode 4 is formed by sputtering under the oxygen partial pressure which is defined by the point B in FIG. 2 or 5, the specific resistance $\rho$ is increased as a result of which the resistance of the entire optically transmissive electrode 4 is increased.

Accordingly, an object of the invention is to provide a light receiving element in which, with the electric current ratio for light and dark intensities maintained large, the resistance of the entire optically transmissive electrode is made low.

SUMMARY OF THE INVENTION

In accordance with this and other objects of the invention, there is provided a film type light receiving element including an insulating substrate having a flat and smooth surface with metal electrodes and a photoconductive film provided in the form of layers on the flat and smooth surface. An optically transmissive electrode film is formed on the photoconductive film. A portion of the optically transmissive electrode film adjacent the photoconductive film has a high specific resistance while the remaining portion has a low specific resistance.

Yet further, the invention can be practiced by a method of manufacturing a film type light receiving element, and by a product manufactured by this method, including the steps of forming metal electrodes and a photoconductive film in the form of layers on a flat and smooth surface of a substrate, and forming an optically transmissive electrode film on the photoconductive film with a magnetron type sputtering technique. A portion of the optically transmissive electrode film adjacent the photoconductive film is formed with a high specific resistance while the remaining portion has a low specific resistance. To accomplish this, during the formation of the portion having a low specific resistance, sputtering is performed at an oxygen partial pressure close to a value at which a minimum specific resistance is obtained while during formation of the portion having a high specific resistance the oxygen partial pressure is higher than the value at which the minimum specific resistance is obtained.

DESCRIPTION OF THE PREFERRED EMBODIMENTS

Figure 1:
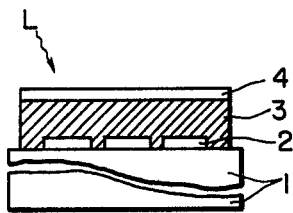
FIG. 1 is an explanatory diagram showing a sectional structure of a conventional film type light receiving element.
Figure 6:
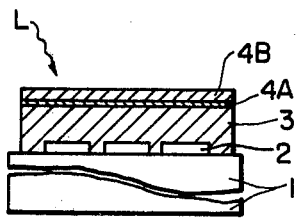
FIG. 6 is a sectional view of a film type light receiving element according to the invention.

A preferred embodiment of the invention is illustrated in FIG. 6, in which those components which have been previously described with reference to FIG. 1 are similarly numbered.

Figure 2:
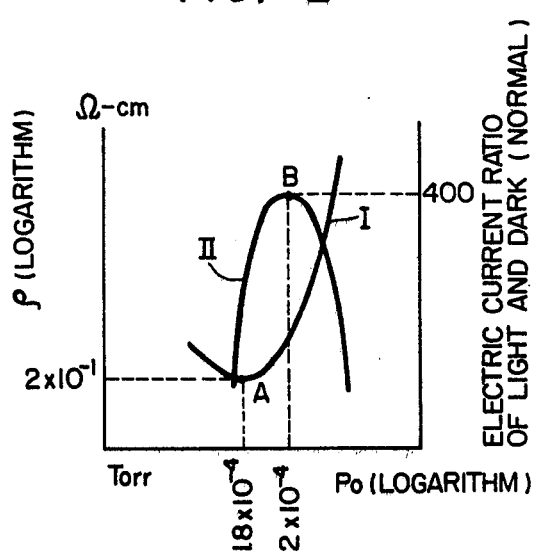
FIG. 2 is a graphical representation indicating an example of the relation between sputtered $SnO_2$ film specific resistance, electric current ratio for light and dark intensities and oxygen partial pressure.
Figure 3:
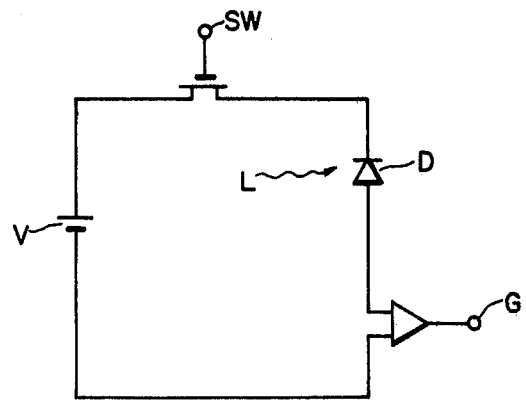
FIG. 3 is a circuit diagram showing an example of a drive circuit for driving a film type light receiving element.
Figure 4:
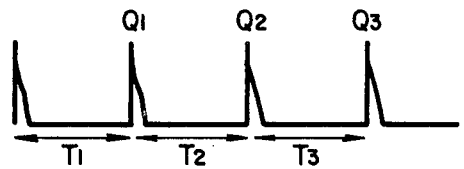
FIG. 4 is a diagram showing an example of an output signal produced when the film type light receiving element is operated in an accumulation mode.

In FIG. 6, reference character 4A designates an optically transmissive electrode having a high specific resistance and reference character 4B designates an optically transmissive electrode having a low specific resistance corresponding to the point A in FIG. 2.

In the light receiving element according to the invention, the specific resistance of the $SnO_2$ film 4A which is in contact with the P type semiconductor, i.e. the Se-As-Te film 3, is high as described above. Accordingly, the amount of Hall current injected into the Se-As-Te film 3 from the $SnO_2$ film 4A is small. This means that, when no light is applied, the dark current is decreased. On the other hand, when light is applied to a certain extent, the injection of Hall current is scarcely affected by the presence of the high specific resistance layer 4A and accordingly a high electric current ratio for light and dark intensities is obtained. In addition, the electrical conductivity of the combination of the optically transmissive electrodes 4A and 4B is maintained satisfactory. Thus, according to the invention, both the electric current ratio for light and dark intensities of the light receiving element and the electrical conductivity of the optically transmissive electrodes are maintained high.

A method of manufacturing a film type light receiving element according to the invention will be described with reference to specific examples.

EXAMPLE 1

The surface of a substrate 1 of quartz glass was optically polished. Each belt-shaped electrode 2 was a laminated film having a Cr base layer 700 Å in thickness and an Au layer 800 Å in thickness. A film of 5% As–95% Se was formed on the electrode 2 to a thickness of 2 μm by vacuum evaporation. Furthermore, a layer of 5% As–20% Te–75% Se and a layer of 5% As–95% Se were formed on the film, in the stated order, to provide a preliminary element.

In order to make the size of the light receiving section 100 μm × 100 μm, a mask for the optically transmissive electrodes was placed on the element and the element with the mask was placed in a magnetron type sputtering device. An SnO₂ sintered body was used as a target.

After the pressure in the vacuum chamber was reduced to about $10^{-7}$ Torr, oxygen was introduced into the vacuum chamber until the pressure was raised to $6\times 10^{-4}$ Torr. After the oxygen partial pressure was stabilized, a sputtering gas, namely, argon was introduced into the vacuum chamber until the pressure reached $3.5\times 10^{-3}$ Torr.

After pre-sputtering was carried out for a suitable period of time, an SnO₂ film was formed on the Se-As-Te film to a thickness of 200 Å. Thereafter, under an oxygen partial pressure of $1.8\times 10^{-4}$ Torr and an argon pressure of $3.5\times 10^{-3}$ Torr, an SnO₂ film was formed on the aforementioned SnO₂ film to a thickness of 1000 Å.

An optically transmissive, compound SnO₂ film composed of the high specific resistance part 4A and the low specific resistance part 4B which were formed as described above had an optical transmissivity higher than 80% and a sheet resistance lower than 100 KΩ. Thus, the compound SnO₂ film satisfied the requirements as the light receiving element.

The light receiving element had an electric current ratio for light and dark intensities of 400 and an optical sensitivity of larger than 10 Pa/lux. It can readily be appreciated that the light receiving element of the invention has a much more excellent reproducibility characteristic and electric current ratio for light and dark input intensities than an element manufactured according to the conventional method. In addition, the light receiving element according to the invention has a more excellent stability characteristic and longer service life than a conventional light receiving element.

EXAMPLE 2

In sputtering the optically transmissive electrode layers, instead of the SnO₂ sintered body as used in Example 1, a 90% In₂O₃–10% SnO₂ sintered body was employed as the target.

The manufacturing procedure in Example 2 was the same as that of Example 1 except for the following. The pressure in the vacuum chamber of the sputtering device was set to lower than $2\times 10^{-5}$ Torr before oxygen was introduced thereinto. The oxygen partial pressure in forming the high specific resistance layer and the low specific resistance layer were set to $2.5\times 10^{-4}$ Torr and $1.5\times 10^{-4}$ Torr, respectively. The thickness of the low specific resistance optically transmissive electrode layer 4B was 1500 Å.

Figure 5:
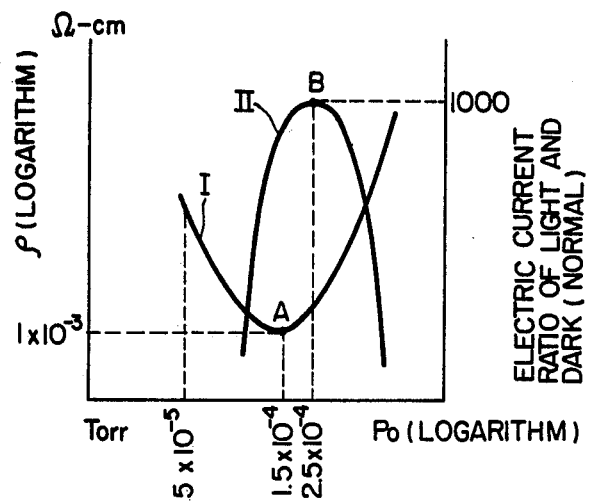
FIG. 5 is a graphical representing indicating an example of the relation between sputtered ITO film specific resistance, electric current ratio for light and dark intensities and oxygen partial pressure.

The above-described various values were determined according to the relations between the oxygen partial pressure $P_o$ and ITO transmissive film specific resistance $\rho$ and between the oxygen partial pressure $P_o$ and electric current ratio for light and dark intensities in accordance with the graphs shown in FIG. 5.

The ITO compound film provided in Example 2 had an optical transmissivity of larger than 75% and a sheet resistance of lower than 1 KΩ thus satisfying the requirements for the light receiving element. The electric current ratio for light and dark intensities and the optical sensitivity of the light receiving element were 500 and more than 10 Pa/lux, respectively. Thus, the light receiving element was excellent in all of the reproducibility characteristic, electric current ratio for light and dark intensities and optically transmissive electrode conductivity compared with a light receiving element manufactured according to the conventional method.

As is apparent from the above description, according to the invention, the optically transmissive electrode in contact with the photoconductive layer is a high specific resistance layer. Accordingly, the dark current is greatly reduced as a result of which the effect of one element on adjacent elements is decreased and therefore the background noise is greatly reduced.

What is claimed is:

1. A film type light receiving element comprising: an insulating substrate having a flat and smooth surface; metal electrodes and a photoconductive film provided in the form of layers on said flat and smooth surface; and an optically transmissive electrode film formed on said photoconductive film, a portion of said optically transmissive electrode film adjacent said photoconductive film having a high specific resistance and the remaining portion having a low specific resistance layer.

2. A method of manufacturing a film type light receiving element comprising the steps of: forming metal electrodes and a photoconductive film in the form of layers on a flat and smooth substrate; and forming an optically transmissive electrode film on said photoconductive film by magnetron type sputtering, wherein a portion of said optically transmissive electrode film adjacent said photoconductive film has a high specific resistance and the remaining portion has a low specific resistance and wherein during the formation of said portion having a low specific resistance sputtering is performed at an oxygen partial pressure close to a value at which a minimum specific resistance is obtained and during formation of said portion having a high specific resistance, said oxygen partial pressure is higher than said value at which said minimum specific resistance is obtained.

3. A method for manufacturing a film type light receiving element comprising the steps of: providing a substrate of quartz glass having an optically polished surface; forming a belt-shaped Cr base layer having a thickness of 700 Å; forming an Au layer upon said Cr base layer having a thickness of 800 Å; forming a film of 5% As–95% Se upon said Au layer and a portion of said surface to a thickness of 2 μm by vacuum evaporation; forming a layer of 5% As–20% Te–75% Se; forming a layer of 5% As–95% Se on the last-mentioned layer; masking the element thus constructed for the formation of optically transmissive electrodes; disposing said element thus formed in a magnetron type sputtering device using an SnO₂ sintered body as a target; reducing the pressure in a vacuum chamber of said sputtering device in which said element is disposed to a pressure of approximately $10^{-7}$ Torr; introducing oxygen into said vacuum chamber until the pressure therein is $6\times 10^{-4}$ Torr; introducing argon into said vacuum chamber until the pressure therein reaches $3.5\times 10^{-3}$ Torr; pre-sputtering said element; forming an SnO₂ film to a thickness of 200 Å; reducing the oxygen partial pressure in said vacuum chamber to $1.8\times 10^{-4}$ Torr with an argon pressure of $3.5\times 10^{-3}$ Torr; and forming an SnO₂ film to a thickness of 1000 Å.

4. A method of manufacturing a film type light receiving element comprising the steps of: providing a substrate of quartz glass having an optically polished surface; forming a belt-shaped Cr base layer having a thickness of 700 Å; forming an Au layer upon said Cr base layer having a thickness of 800 Å; forming a film of 5% As–95% Se upon said Au layer and a portion of said surface to a thickness of 2 μm by vacuum evaporation; forming a layer of 5% As–20% Te –75% Se; forming a layer of 5% As–95% Se on the last-mentioned layer; masking the element thus constructed for the formation of optically transmissive electrodes; disposing said element thus formed in a magnetron type sputtering device using a 90% $In_2O_3$–10% $SnO_2$ sintered body as a target; reducing the pressure in a vacuum chamber of said sputtering device in which said element is disposed to a pressure of less than $2 \times 10^{-5}$ Torr; introducing oxygen into said vacuum chamber until the pressure therein is $2.5 \times 10^{-4}$ Torr; introducing argon into said vacuum chamber until the pressure therein reaches $1.5 \times 10^{-4}$ Torr; pre-sputtering said element; forming an $SnO_2$ film to a thickness of 200 Å; reducing the oxygen partial pressure in said vacuum chamber to $1.8 \times 10^{-4}$ Torr with an argon pressure of $3.5 \times 10^{-3}$ Torr; and forming an $SnO_2$ film to a thickness of 1500 Å.

5. A film type light receiving element produced by the method comprising the steps of: forming metal electrodes and a photoconductive film in the form of layers on a flat and smooth substrate; and forming an optically transmissive electrode film on said photoconductive film by magnetron type sputtering, wherein a portion of said optically transmissive electrode film adjacent said photoconductive film has a high specific resistance and the remaining portion has a low specific resistance and wherein during the formation of said portion having a low specific resistance sputtering is performed at an oxygen partial pressure close to a value at which a minimum specific resistance is obtained and during formation of said portion having a high specific resistance, said oxygen partial pressure is higher than said value at which said minimum specific resistance is obtained.

6. A film type light receiving element produced by the method comprising the steps of: providing a substrate of quartz glass having an optically polished surface; forming a belt-shaped Cr base layer having a thickness of 700 Å; forming an Au layer upon said Cr base layer having a thickness of 800 Å; forming a film of 5% As–95% Se upon said Au layer and a portion of said surface to a thickness of 2 μm by vacuum evaporation; forming a layer of 5% As–20% Te–75% Se; forming a layer of 5% As–95% Se on the last-mentioned layer; masking the element thus constructed for the formation of optically transmissive electrodes; disposing said element thus formed in a magnetron type sputtering device using an $SnO_2$ sintered body as a target; reducing the pressure in a vacuum chamber of said sputtering device in which said element is disposed to a pressure of approximately $10^{-7}$ Torr; introducing oxygen into said vacuum chamber until the pressure therein is $6 \times 10^{-4}$ Torr; introducing argon into said vacuum chamber until the pressure therein reaches $3.5 \times 10^{-3}$ Torr; pre-sputtering said element; forming an $SnO_2$ film to a thickness of 200 Å; reducing the oxygen partial pressure in said vacuum chamber to $1.8 \times 10^{-4}$ Torr with an argon pressure of $3.5 \times 10^{-3}$ Torr; and forming an $SnO_2$ film to a thickness of 1000 Å.

7. A film type light receiving element produced by the method comprising the steps of: providing a substrate of quartz glass having an optically polished surface; forming a belt-shaped Cr base layer having a thickness of 700 Å; forming an Au layer upon said Cr base layer having a thickness of 800 A; forming a film of 5% As–95% Se upon said Au layer and a portion of said surface to a thickness of 2 μm by vacuum evaporation; forming a layer of 5% As–20% Te–75% Se; forming a layer of 5% As–95% Se on the last-mentioned layer; masking the element thus constructed for the formation of optically transmissive electrodes; disposing said element thus formed in a magnetron type sputtering device using a 90% $In_2O_3$–10% $SnO_2$ sintered body as a target; reducing the pressure in a vacuum chamber of said sputtering device in which said element is disposed to a pressure of less than $2 \times 10^{-5}$ Torr; introducing oxygen into said vacuum chamber until the pressure therein is $2.5 \times 10^{-4}$ Torr; introducing argon into said vacuum chamber until the pressure therein reaches $1.5 \times 10^{-4}$ Torr; pre-sputtering said element; forming an $SnO_2$ film to a thickness of 200 Å; reducing the oxygen partial pressure in said vacuum chamber to $1.8 \times 10^{-4}$ Torr with an argon pressure of $3.5 \times 10^{-3}$ Torr; and forming an $SnO_2$ film to a thickness of 1500 Å.

* * * * *